US008864860B2

(12) United States Patent
Hirano et al.

(10) Patent No.: US 8,864,860 B2
(45) Date of Patent: Oct. 21, 2014

(54) POLISHING COMPOSITION

(75) Inventors: Tatsuhiko Hirano, Kiyosu (JP); Hiroshi Mizuno, Kiyosu (JP); Yasuyuki Yamato, Kiyosu (JP); Akihito Yasui, Kiyosu (JP)

(73) Assignee: Fujimi Incorporated, Kiyosu-shi (JP)

( * ) Notice: Subject to any disclaimer, the term of this patent is extended or adjusted under 35 U.S.C. 154(b) by 507 days.

(21) Appl. No.: 12/341,241

(22) Filed: Dec. 22, 2008

(65) Prior Publication Data

US 2009/0173910 A1 Jul. 9, 2009

(30) Foreign Application Priority Data

Dec. 28, 2007 (JP) ................................. 2007-339472

(51) Int. Cl.
*B24D 3/02* (2006.01)
*C09C 1/68* (2006.01)
*C09K 3/14* (2006.01)
*C09G 1/02* (2006.01)
*H01L 21/321* (2006.01)

(52) U.S. Cl.
CPC .............. *C09G 1/02* (2013.01); *H01L 21/3212* (2013.01); *C09K 3/1463* (2013.01)
USPC ................................... 51/307; 51/308; 51/309

(58) Field of Classification Search
USPC ......................................... 106/3; 51/307–309
See application file for complete search history.

(56) References Cited

U.S. PATENT DOCUMENTS

| | | | |
|---|---|---|---|
| 5,391,258 A | 2/1995 | Brancaleoni et al. | |
| 5,428,721 A | 6/1995 | Sato et al. | |
| 5,476,606 A | 12/1995 | Brancaleoni et al. | |
| 5,575,885 A | 11/1996 | Hirabayashi et al. | |
| 5,770,095 A | 6/1998 | Sasaki et al. | |
| 5,858,813 A | 1/1999 | Scherber et al. | |
| 5,954,997 A | 9/1999 | Kaufman et al. | |
| 6,126,853 A | 10/2000 | Kaufman et al. | |
| 6,428,721 B1 | 8/2002 | Ina et al. | |
| 6,432,828 B2 | 8/2002 | Kaufman et al. | |
| 6,440,186 B1 | 8/2002 | Sakai et al. | |
| 6,568,996 B2 | 5/2003 | Kobayashi et al. | |
| 6,679,929 B2 | 1/2004 | Asano et al. | |
| 6,689,692 B1 | 2/2004 | Grover et al. | |
| 6,773,476 B2 | 8/2004 | Sakai et al. | |
| 6,814,767 B2 | 11/2004 | Hirano | |
| 6,838,016 B2 | 1/2005 | Sakai et al. | |
| 6,872,329 B2 * | 3/2005 | Wang et al. | 252/79.1 |
| 6,896,591 B2 * | 5/2005 | Chaneyalew et al. | 451/41 |
| 6,924,227 B2 * | 8/2005 | Minamihaba et al. | 438/633 |
| 7,485,162 B2 | 2/2009 | Matsuda et al. | |
| 2003/0166337 A1 | 9/2003 | Wang et al. | |
| 2003/0219982 A1 | 11/2003 | Kurata et al. | |
| 2003/0228762 A1 * | 12/2003 | Moeggenborg et al. | 438/691 |
| 2004/0020134 A1 * | 2/2004 | Kim et al. | 51/307 |
| 2004/0084414 A1 | 5/2004 | Sakai et al. | |
| 2004/0134376 A1 * | 7/2004 | Hirano | 106/3 |
| 2005/0187118 A1 * | 8/2005 | Haraguchi et al. | 510/175 |
| 2006/0060974 A1 | 3/2006 | Hirano et al. | |
| 2008/0032505 A1 | 2/2008 | Kawamura et al. | |

FOREIGN PATENT DOCUMENTS

| | | |
|---|---|---|
| EP | 1 137 056 A1 | 9/2001 |
| EP | 1 150 341 A1 | 10/2001 |
| EP | 1 211 717 A1 | 6/2002 |
| EP | 1 223 609 A1 | 7/2002 |
| JP | 11-21546 | 1/1999 |
| JP | 2002-155268 | 5/2002 |
| JP | 2005-109256 A | 4/2005 |
| JP | 2006-502579 | 1/2006 |
| JP | 2006-106616 A | 4/2006 |
| WO | WO 00/13217 | 3/2000 |
| WO | WO 00/39844 | 7/2000 |
| WO | WO 01/13417 A1 | 2/2001 |
| WO | WO 01/17006 A1 | 3/2001 |
| WO | WO 03/020839 A1 | 3/2003 |
| WO | WO 03/104350 A1 | 12/2003 |
| WO | WO 2004/033574 A1 | 4/2004 |

OTHER PUBLICATIONS

Japanese Office Action Issued Mar. 15, 2013 in Patent Application No. 2007-339472 (with English translation).

* cited by examiner

*Primary Examiner* — Shuangyi Abu Ali
(74) *Attorney, Agent, or Firm* — Oblon, Spivak, McClelland, Maier & Neustadt, L.L.P.

(57) ABSTRACT

To provide a polishing composition which can satisfy both suppression of the surface topography and a high stock removal rate, in a polishing step in the production of a wiring structure.

A polishing composition comprising abrasive grains, a processing accelerator, a nonionic surfactant represented by R-POE (I) (wherein R is a $C_{10-16}$ alkyl group having a branched structure, and POE is a polyoxyethylene chain) and having an HLB of from 7 to 12, an anionic surfactant, a protective film-forming agent, an oxidizing agent, and water.

18 Claims, No Drawings

POLISHING COMPOSITION

BACKGROUND OF THE INVENTION

1. Field of the Invention

The present invention relates to a polishing composition. More specifically, the present invention relates to a polishing composition to be used in a polishing step for forming e.g. a semiconductor device.

2. Discussion of Background

In recent years, along with the progress in the integration and speed of ULSI, etc. to be used for computers, a design rule of semiconductor devices has been progressively refined. To cope with an increase in electrical resistance of wiring due to such refinement of a wiring structure of a semiconductor device, it is considered to use a metal material containing copper, as a wiring material.

When a metal material containing copper is used as a wiring material, formation of a wiring structure by anisotropic etching is difficult due to the nature of the metal material. Therefore, it is common that such a wiring structure is formed by e.g. a method using chemical mechanical polishing (hereinafter referred to as a CMP method). Specifically, the following method is used. First, a barrier film made of tantalum or a tantalum-containing compound such as tantalum nitride, or a titanium compound or a ruthenium compound, is formed on an insulation film having wiring trenches engraved on its surface. Then, a conductor film made of a metal material containing copper, is formed on the barrier film so as to, at least, completely fill the wiring trenches. Then, in the first polishing step, a part of the conductor film is polished. Further, in the second polishing step, the conductor film is polished until the barrier film is exposed at portions other than the wiring trenches. Furthermore, in the third polishing step, the barrier film is polished until the insulation film is exposed at portions other than the wiring trenches, thereby to form wiring portions in the wiring trenches.

Heretofore, as a polishing composition, one comprising an abrasive such as silicon dioxide and various additives, has been considered. However, in a polishing method as described above, a conventional polishing composition was likely to polish a conductor film excessively, since it had a high stock removal rate against a metal material containing copper. In such a case, there was sometimes a problem of dishing observed on the polished surface after the polishing, i.e. a phenomenon such that the surface of the conductor film at portions corresponding to the wiring trenches, is recessed lower than the surface of the barrier film.

A polishing composition to suppress such dishing, has been considered. For example, Patent Document 1 discloses a slurry for CMP, which comprises a solvent, abrasive particles, at least one type of the first surfactant and at least one type of the second surfactant. In such a slurry, the first surfactant is one to improve the dispersibility of the abrasive particles and to increase denseness of a surface protective film to be formed on the surface of a metal film as a film to be polished during polishing, and the second surfactant is one to improve the dispersibility of the abrasive particles and to increase denseness and hydrophilicity of the surface protective film, and further to improve the hydrophilicity of the surface of a polishing pad to be used during polishing. However, as long as the present inventors know, if the denseness of the surface protective film becomes too high, an adequate stock removal rate could not sometimes be obtained although dishing may be suppressed, and thus, there was still a room for improvement. Further, in such a technique, the structures of surfactants themselves are significantly important elements, and it has been found that a suitable performance cannot be obtained simply by adding the two types of surfactants. For example, if a nonion surfactant having a large molecular weight, is used, a phenomenon is observed wherein the dispersion stability is deteriorated, and in the case of a surfactant having a high HLB, a phenomenon is observed wherein dishing becomes large.

Further, Patent Document 2 discloses a method of polishing a substrate having a metal layer containing copper by contacting it with a CMP composition comprising (a) abrasive particles, (b) an amphipathic nonionic surfactant having an HLB value of more than 6, (c) a means to oxidize the metal layer, (d) an organic acid, (e) a corrosion inhibitor and (f) a liquid carrier. However, as long as the present inventors know, even in such a method, it has been found difficult to reduce dishing while maintaining the stock removal rate, only by using the nonionic surfactant alone. Further, with a nonionic surfactant having an HLB of more than 12, it was difficult to reduce dishing.

Patent Document 1: JP-A-2002-155268
Patent Document 2: JP-A-2006-502579

SUMMARY OF THE INVENTION

As mentioned above, with conventional polishing compositions, it has been impossible to satisfy both improvement of the stock removal rate and reduction of the dishing, and it has been desired to develop a polishing composition which is capable of solving such a dilemma.

The polishing composition of the present invention comprises (a) abrasive grains, (b) a processing accelerator, (c) at least one nonionic surfactant represented by R-POE (I) (wherein R is a $C_{10-16}$ alkyl group having a branched structure, and POE is a polyoxyethylene chain) and having an HLB of from 7 to 12, (d) at least one anionic surfactant, (e) a protective film-forming agent different from the nonionic surfactant or the anionic surfactant, (f) an oxidizing agent, and (g) water.

According to the present invention, in a polishing step in the production of a wiring structure, it is possible to suppress formation of difference in level on the surface (surface topography) and also to obtain a suitable stock removal rate.

DETAILED DESCRIPTION OF THE PREFERRED EMBODIMENTS

Polishing Composition (a) Abrasive Grains

The abrasive grains to be used in the polishing composition of the present invention, may be selected from conventionally known optional ones, but specifically, they are preferably at least one type selected from the group consisting of silicon dioxide, aluminum oxide, cerium oxide, zirconium oxide and titanium oxide.

The silicon dioxide includes colloidal silica, fumed silica and many other types different in the process for their production or in their properties.

Further, the aluminum oxide includes α-alumina, δ-alumina, θ-alumina, κ-alumina and other types different in form. Further, there is also one called fumed alumina from its production method.

The cerium oxide may, for example, be a trivalent or tetravalent one, depending on its oxidation number, and it may be of a hexagonal crystal system, a cubic crystal system or a face-centered cubic crystal system, depending on its crystal system.

The zirconium oxide may, for example, be of a monoclinic system, a tetragonal system or amorphous depending on its crystal system. Further, there is also one called fumed zirconia from its production method.

The titanium oxide includes titanium monoxide, dititanium trioxide, titanium dioxide and other ones depending on its crystal system. Further, there is also one called fumed titania from its production method.

For the composition of the present invention, it is possible to use them optionally or in combination if necessary. In the case of using them in combination, their combination or proportions to be used are not particularly limited. However, from the viewpoint of the effects of the present invention and of economic efficiency or availability, silicon dioxide is preferred, and colloidal silica is particularly preferred.

The polishing composition of the present invention may contain two or more types of the above abrasive grains. Further, it is possible to use abrasive grains of the same type having two or more different average primary particle sizes, by mixing them. Here, the average primary particle size is one calculated from a specific surface area by a BET method (a nitrogen adsorption method). When abrasive grains having different primary particle sizes are mixed, the primary particle size of the entire abrasive grains can be calculated in such a manner that with respect to the respective abrasive grains, (the weight ratio of the abrasive grains based on the total weight of the entire abrasive grains×the specific surface area of the abrasive grains) is calculated, and from the specific is surface area of the entire abrasive grains obtained from their total, the average primary particle size of the entire abrasive grains is calculated.

The average primary particle size of the abrasive grains to be used for the polishing composition of the present invention, is usually from 5 to 40 nm, preferably from 5 to 20 nm, further preferably from 7 to 15 nm. From the viewpoint that a metal layer, particularly a copper layer, is polished at a sufficient rate, it is preferably at least 5 nm. On the other hand, from the viewpoint that the surface topography is suitably controlled, it is preferably at most 40 nm.

Further, the content of the abrasive grains is usually from 0.1 to 10 wt %, preferably from 0.5 to 3 wt %, further preferably from 0.8 to 2 wt %, based on the total weight of the polishing composition. From the viewpoint that a metal layer, particularly a copper layer is polished at a sufficient rate, it is preferably at least 0.1 wt %, and from the viewpoint that the production cost is suppressed, and that the surface topography is suitably controlled, it is preferably at most 10 wt %.

(b) Processing Accelerator

The polishing composition of the present invention further contains at least one processing accelerator. Such a processing accelerator is one to accelerate a stock removal rate of a metal layer, particularly a copper layer. Its action is to accelerate polishing of the metal layer by capturing metal ions generated by polishing.

Specific examples of the processing accelerator may, preferably, be a carboxylic acid and an amino acid from the viewpoint of excellent metal-capturing action and availability. The amino acid useful as the processing accelerator may, for example, be a neutral amino acid such as glycine, alanine, valine, leucine, isoluecine, alloisoluecine, serine, threonine, allothreonine, cysteine, methionine, phenylalanine, tryptophane, tyrosine, proline or cystine, a basic amino acid such as arginine or histidine, or an acidic amino acid such as glutamic acid or asparaginic acid. The carboxylic acid may, for example, be oxalic acid, citric acid, succinic acid, maleic acid, tartaric acid, 2-quinoline carboxylic acid (quinaldic acid), 2-pyridine carboxylic acid, 2,6-pyridine carboxylic acid or quinone. Among them, the most preferred is glycine.

The content of the processing accelerator in the polishing composition of the present invention is usually from 0.1 to 30 wt %, preferably from 0.5 to 2 wt %, further preferably from 0.5 to 1.5 wt %, based on the total weight of the polishing composition. From the viewpoint that a metal layer, particularly a copper layer is polished at a sufficient rate, it is preferably at least 0.1 wt %, and from the viewpoint that the surface topography is suitably controlled, it is preferably at most 3 wt %.

(c) Nonionic Surfactant

The polishing composition of the present invention contains at least one nonionic surfactant. Such a nonionic surfactant is one to function as a stock removal rate adjuster and as a dishing inhibitor. The nonionic surfactant to be used in the present invention is one represented by the following formula (I):

$$R\text{-POE} \tag{I}$$

wherein R is a $C_{10-16}$ alkyl group having a branched structure, and POE is a polyoxyethylene chain.

As such a nonionic surfactant, various types are present depending on the type of R or POE, but among them, it needs to have an HLB value (Hydrophilie-Lipophilie Balance) of from 7 to 12. The HLB value is preferably high in order to increase the stock removal rate of the metal layer, and it is preferably low in order to suitably control the surface topography. From such a viewpoint, HLB is preferably from 7 to 10. Here, HLB is one calculated by using Griffin formula:

$$HLB = ((\text{sum of formula weight of a hydrophilic portion})/\text{molecular weight}) \times 20$$

Further, the R group in the nonionic surfactant represented by the formula (I), needs to have a branched structure, and it needs to have the number of carbon atoms of from 10 to 16. These requirements are influential over the above HLB value, but considering only the number of carbon atoms, it is preferably high to increase the stock removal rate of the metal layer, and it is preferably small to suitably control the surface topography. From such a viewpoint, the number of carbon atoms in the R group is preferably from 11 to 15, more preferably from 12 to 14.

With respect to the nonionic surfactant to be used in the present invention, since the number of carbon atoms of the alkyl group is from 10 to 16, and HLB is from 7 to 12, the molecules of the nonionic surfactant become small, whereby it is considered that the surfactant has an action to suppress aggregation of the abrasive grains. Further, with respect to the nonionic surfactant, generally, when the polyoxyethylene chain is short, the hydrophobicity becomes high, and a strong protective film tends to be formed on the surface of an object to be polished. However, in the polishing composition of the present invention, the hydrophobic alkyl group has a branched structure, whereby it is considered that the protective film for an object to be polished is not excessively dense, and the proper stock removal rate can be obtained.

Further, the content of the nonionic surfactant in the polishing composition is usually from 0.0005 to 0.5 wt %, preferably from 0.01 to 0.2 wt %, further preferably from 0.02 to 0.1 wt %, based on the total weight of the polishing composition. From the viewpoint that a metal layer, particularly a copper layer, is polished at a sufficient rate, it is preferably at least 0.0005 wt %, and from the viewpoint that the surface topography is suitably controlled, it is preferably at most 0.5 wt %.

(d) Anionic Surfactant

The polishing composition of the present invention further contains at least one anionic surfactant. Such an anionic surfactant is one to further increase the effect of suppressing dishing by a combination with the nonionic surfactant. The anionic surfactant can be selected from conventionally known optional ones. However, one exhibiting a strong dishing suppression function by a combination with the nonionic surfactant may, for example, be an anionic surfactant represented by the following formula (IIa) or (IIb):

  (IIa)

  (IIb)

wherein R' is a group selected from the group consisting of an alkyl group, an alkylphenyl group and an alkenyl group, POA is a polyoxyalkylene chain selected from the group consisting of a polyoxyethylene chain, a polyoxypropylene chain and a poly(oxyethylene/oxypropylene) chain, and A is an anionic functional group.

Here, more preferred is an anionic surfactant (IIb) containing a polyoxyalkylene chain.

The content of the anionic surfactant in the polishing composition of the present invention is usually from 0.005 to 0.1 wt %, preferably from 0.001 to 0.05 wt %, further preferably from 0.005 to 0.02 wt %, based on the total weight of the polishing composition. From the viewpoint that the surface topography is suitably controlled, it is preferably at least 0.0005 wt %. Further, from the viewpoint that a metal layer, particularly a copper layer, is polished at a sufficient rate, it is preferably at most 0.1 wt %.

(e) Protective Film-Forming Agent

The polishing composition of the present invention further contains a protective film-forming agent. Such a protective film-forming agent is one having, for example, not only a function as a corrosion inhibitor of the metal layer, to suppress corrosion of the surface of the metal layer by an oxidizing agent which will be described layer, but also a function as a dishing suppressing agent. Such a protective film-forming agent may, for example, be benzotriazole and its derivative, triazole and its derivative, tetrazole and its derivative, indole and its derivative, or imidazole and its derivative. Among them, benzotriazole and its derivative are particularly preferred.

As benzotriazole and its derivative useful in the present invention, various ones may be mentioned, but one represented by the following formula (III) is preferred:

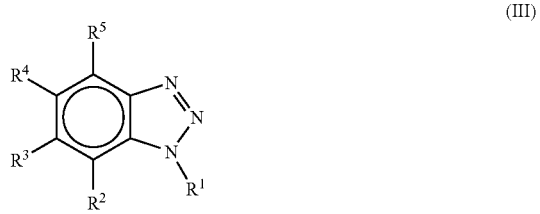  (III)

In the formula, $R^1$ is selected from the group consisting of hydrogen, an alkyl group, an alkyl group substituted with a carboxy group, an alkyl group substituted with a hydroxyl group and a tertiary amino group, and an alkyl group substituted with a hydroxyl group, and each of $R^2$ to $R^5$ is independently one selected from the group consisting of hydrogen and a $C_{1-3}$ alkyl group.

Specific examples may be benzotriazole, 4-methyl-1H-benzotriazole, 5-methyl-1H-benzotriazole, 1-(2',3'-dihydroxypropyl)benzotriazole, 1-(2',3'-dihydroxypropyl)-4-methylbenzotriazole, 1-(2',3'-dihydroxypropyl)-5-methylbenzotriazole, 1-[N,N-bis(hydroxyethyl)aminomethyl]benzotriazole, 1-[N,N-bis(hydroxyethyl)aminomethyl]-4-methylbenzotriazole, 1-[N,N-bis(hydroxyethyl)aminomethyl]-5-methylbenzotriazole, 1-hydroxymethyl-1H-benzotriazole, 1-hydroxymethyl-4-methyl-1H-benzotriazole, 1-hydroxymethyl-5-methyl-1H-benzotriazole, 3-(4-methyl-1H-benzotriazole-1-yl) butyric acid, 3-(5-methyl-1H-benzotriazole-1-yl) butyric acid, α-methyl-1H-benzotriazole-1-methanol, α-ethyl-1H-benzotriazole-1-methanol, α-isopropyl-1H-benzotriazole-1-methanol, 1H-benzotriazole-1-acetic acid, 1-(2-hydroxyethyl)-1H-benzotriazole, 1-[[bis(2-hydroxypropyl)amino]methyl-1H-benzotriazole and 4,5-dimethyl-1H-benzotriazole.

Among them, a preferred benzotriazole in the present invention is 1-[bis(2-hydroxyethyl)aminomethyl]-4-methylbenzotriazole, 1-[bis(2-hydroxyethyl)aminomethyl]-5-methylbenzotriazole, or their mixture.

The content of the protective film-forming agent in the polishing composition of the present invention is usually from 0.001 to 0.3 wt %, preferably from 0.01 to 0.1 wt %, further preferably from 0.02 to 0.05 wt %, based on the total weight of the polishing composition. From the viewpoint that the stock removal rate of the metal layer is properly suppressed, that dishing is sufficiently reduced, and that the surface topography is suitably controlled, it is preferably at least 0.001 wt %. On the other hand, it is preferably at most 0.3 wt % for not reducing the stock removal rate too much by excessively suppressing the stock removal rate of the metal layer.

(f) Oxidizing Agent

The polishing composition of the present invention contains an oxidizing agent. Such an oxidizing agent is one having an action to accelerate polishing of the metal layer. The oxidizing agent may be at least one member selected from hydrogen peroxide, persulfuric acid, periodic acid, perchloric acid, peracetic acid, performic acid and nitric acid, and their salts. Hydrogen peroxide is preferred from the viewpoint that its cost is low and that it is possible to easily obtain one having a small amount of metal impurities.

The content of the oxidizing agent in the polishing composition of the present invention is preferably at least 0.3 wt %, more preferably at least 0.5 wt %, particularly preferably at least 0.75 wt %, based on the total weight of the polishing composition, from the viewpoint that a sufficient stock removal rate of the metal layer is obtained, and particularly that a high stock removal rate can be achieved also for an object to be polished where an altered layer such as an oxidized film is formed on the surface, or a wafer having patterns. On the other hand, the content of the oxidizing agent is preferably at most 5 wt %, more preferably at most 3 wt %, particularly preferably at most 1.5 wt %, from the viewpoint that the surface topography is suitably controlled.

(g) Water

The polishing composition of the present invention contains water as a solvent to disperse or dissolve the respective components. Water is preferably water which does not contain impurities as far as possible with a view to suppressing hindrance to the actions of other components. Specifically, it is preferably pure water or ultrapure water wherein impurity ions are removed by an ion exchange resin followed by removing foreign objects by a filter, or distilled water.

(h) Other Components

To the polishing composition of the present invention, it is possible to incorporate other components such as a chelating agent, a thickener, an emulsifier, an anti-corrosive agent, a preservative, a mildew proofing agent and an antifoaming agent, as the case requires, in accordance with information.

The polishing composition of the present invention is prepared by dissolving or dispersing the respective components in water. The method of dissolving or dispersing is optional, and the mixing order or mixing method of the respective components is not particularly limited.

The pH of the polishing composition of the present invention is not particularly limited, but it may be adjusted by adding a known acid or alkali. Its pH is preferably from 8 to 10, more preferably from 9 to 10, from the viewpoint that the good handling efficiency of the polishing composition is maintained.

The polishing composition of the present invention may be prepared, stored or transported, as a stock solution having a relatively high concentration, and it may be diluted for use at the time of actual polishing processing. The above-mentioned preferred concentration range is one at the time of actual polishing processing, and when such a method of use is employed. It is needless to say that in a state of being stored or transported, the solution will have a higher concentration.

Now, the present invention will be described with reference to Examples.

Preparation of Polishing Compositions

Polishing compositions were prepared by blending colloidal silica as the abrasive grains, glycine as the processing accelerator, hydrogen peroxide as the oxidizing agent, an anionic surfactant, a nonionic surfactant and the protective film-forming agent, as shown in Table 1.

TABLE 1

| | Colloidal silica | | Glycine | Hydrogen peroxide | Anionic surfactant | | Nonionic surfactant | | | | Protective film-forming agent | |
|---|---|---|---|---|---|---|---|---|---|---|---|---|
| | Average primary particle size | Amount added (wt %) | Amount added (wt %) | Amount added (wt %) | Type | Amount added (wt %) | Number of carbon atoms | Branch | HLB | Amount added (wt %) | Type | Amount added (wt %) |
| Ex. 1 | 12 | 1 | 0.9 | 1.09 | A1 | 0.015 | 13 | Present | 8 | 0.090 | E1 | 0.020 |
| Ex. 2 | 12 | 1 | 0.9 | 1.09 | A1 | 0.015 | 13 | Present | 10 | 0.090 | E1 | 0.020 |
| Ex. 3 | 12 | 1 | 0.9 | 1.09 | A1 | 0.009 | 13 | Present | 12 | 0.090 | E1 | 0.020 |
| Ex. 4 | 12 | 1 | 0.7 | 1.09 | A1 | 0.009 | 13 | Present | 8 | 0.045 | E1 | 0.020 |
| Ex. 5 | 12 | 1 | 1.2 | 1.09 | A1 | 0.009 | 13 | Present | 8 | 0.045 | E1 | 0.020 |
| Ex. 6 | 12 | 1 | 0.9 | 1.09 | A1 | 0.009 | 13 | Present | 8 | 0.045 | E1 | 0.024 |
| Ex. 7 | 12 | 1 | 0.9 | 1.09 | A1 | 0.009 | 13 | Present | 8 | 0.045 | E1 | 0.016 |
| Ex. 8 | 12 | 1 | 0.9 | 1.09 | A1 | 0.009 | 13 | Present | 8 | 0.045 | E1 | 0.028 |
| Ex. 9 | 12 | 1 | 0.9 | 1.09 | A1 | 0.015 | 10 | Present | 8 | 0.090 | E1 | 0.024 |
| Ex. 10 | 12 | 1 | 0.9 | 1.09 | A1 | 0.015 | 16 | Present | 8 | 0.090 | E1 | 0.024 |
| Ex. 11 | 12 | 1 | 0.9 | 1.09 | A2 | 0.015 | 13 | Present | 8 | 0.090 | E1 | 0.020 |
| Ex. 12 | 12 | 1 | 0.9 | 1.09 | A3 | 0.023 | 13 | Present | 8 | 0.090 | E1 | 0.020 |
| Ex. 13 | 12 | 1 | 0.9 | 1.09 | A1 | 0.009 | 13 | Present | 8 | 0.030 | E1 | 0.022 |
| Ex. 14 | 20 | 1 | 0.9 | 1.09 | A1 | 0.009 | 13 | Present | 8 | 0.030 | E1 | 0.022 |
| Ex. 15 | 12 | 1 | 0.9 | 1.09 | A1 | 0.009 | 13 | Present | 8 | 0.045 | E2 | 0.020 |
| Ex. 16 | 12 | 1 | 0.9 | 1.09 | A1 | 0.009 | 13 | Present | 8 | 0.045 | E3 | 0.010 |
| Comp. Ex. 1 | 12 | 1 | 0.9 | 1.09 | A1 | 0.015 | 12 | Absent | 11 | 0.090 | E1 | 0.020 |
| Comp. Ex. 2 | 12 | 1 | 0.9 | 1.09 | A1 | 0.015 | 10 | Absent | 8 | 0.090 | E1 | 0.020 |
| Comp. Ex. 3 | 12 | 1 | 0.9 | 1.09 | A1 | 0.015 | 8 | Present | 8 | 0.090 | E1 | 0.020 |
| Comp. Ex. 4 | 12 | 1 | 0.9 | 1.09 | A1 | 0.015 | 18 | Present | 8 | 0.090 | E1 | 0.020 |
| Comp. Ex. 5 | 12 | 1 | 0.9 | 1.09 | A1 | 0.015 | 13 | Present | 7 | 0.010 | E1 | 0.020 |
| Comp. Ex. 6 | 12 | 1 | 0.9 | 1.09 | A1 | 0.015 | 13 | Present | 14 | 0.090 | E1 | 0.020 |
| Comp. Ex. 7 | — | — | 0.9 | 1.09 | A1 | 0.008 | 13 | Present | 8 | 0.045 | E1 | 0.022 |
| Comp. Ex. 8 | 12 | 1 | — | 1.09 | A1 | 0.008 | 13 | Present | 8 | 0.045 | E1 | 0.022 |
| Comp. Ex. 9 | 12 | 1 | 0.9 | — | A1 | 0.008 | 13 | Present | 8 | 0.045 | E1 | 0.022 |
| Comp. Ex. 10 | 12 | 1 | 0.9 | 1.09 | — | — | 13 | Present | 8 | 0.045 | E1 | 0.022 |
| Comp. Ex. 11 | 12 | 1 | 0.9 | 1.09 | A1 | 0.008 | — | — | — | — | E1 | 0.022 |
| Comp. Ex. 12 | 12 | 1 | 0.9 | 1.09 | A1 | 0.008 | 13 | Present | 8 | 0.045 | — | — |

A1: Ammonium polyoxyethylene (2.5) lauryl ether sulfate
A2: Ammonium laurylether sulfate
A3: Ammonium dodecylbenzene sulfonate
E1: 1-[bis(2-hydroxyethyl)aminomethyl]-4(or 5)-methylbenzotriazole
E2: 1-[N,N-bis(hydroxyethyl)aminomethyl]benzotriazole
E3: 1-hydroxymethyl-1H-benzotriazole Evaluation of Stock Removal Rate By using the obtained polishing compositions, the stock removal rates were evaluated in accordance with the following polishing condition 1.

Polishing Condition 1

Polishing machine: polishing machine for one side CMP (Relexion LK; manufactured by APPLIED MATERIALS, INC.)

Object to be polished: Cu blanket wafer (diameter: 300 mm)

Polishing pad: polyurethane lamination polishing pad (tradename: IC-1010, manufactured by Rohm and Haas Company)

Polishing pressure: 0.9 psi (=about 6.2 kPa)

Number of revolutions of platen: 100 rpm

Supplying rate of polishing composition: 300 ml/min

Number of revolutions of carrier: 100 rpm

Calculation Formula for Stock Removal Rate

Stock removal rate [nm/min]=(thickness (nm) of blanket wafer before polishing−thickness (nm) of blanket wafer after polishing)÷polishing time (min)

The thickness of the Cu blanket wafer before and after the polishing processing was measured by using a sheet resistance measuring device (tradename: VR-120SD/8, manufactured by Hitachi Kokusai Electric Inc.). The obtained results are shown in Table 2. Further, it is usually considered that there is no practical problem if the stock removal rate is 300 nm/min.

Measurement of Surface Topography

On the surface of a Cu patterned wafer, by using the polishing composition of each Example, polishing was carried out until the Cu residual film became 300 nm under the following polishing condition 2. After the above polishing, on the surface of the copper patterned wafer, polishing was carried out until the barrier film was exposed, by using the polishing composition of each Example, under the following polishing condition 3. Then, the dishing amount was measured in an isolated wiring portion of 100 μm in width on the copper patterned wafer after the second polishing, by using an atomic force microscope (tradename: WA-1300, manufactured by Hitachi Construction Machinery Co., Ltd.). The dishing amount was evaluated by 4 levels i.e. less than 15 nm (⊚), at least 15 nm and less than 30 nm (○), at least 30 nm and less than 50 nm (Δ), and at least 50 nm (X) The obtained results are shown in Table 2.

Polishing Condition 2

Polishing machine: polishing machine for one side CMP (Relexion LK; manufactured by APPLIED MATERIALS, INC.)

Object to be polished: Cu patterned wafer (754 musk pattern, film thickness: 1,000 Å, initial concave trenches: 5,000 Å, manufactured by ATDF)

Polishing pad: polyurethane lamination polishing pad (tradename: IC-1010, manufactured by Rohm and Haas Company)

Polishing pressure: 2 psi (=about 14 kPa)

Number of revolutions of platen: 100 rpm

Supplying rate of polishing composition: 200 ml/min

Number of revolutions of carrier: 100 rpm

Polishing Condition 3

Polishing machine: polishing machine for one side CMP (Relexion LK; manufactured by APPLIED MATERIALS, INC.)

Object to be polished: Cu patterned wafer (754 musk pattern, film thickness: 1,000 Å, initial concave trenches: 5,000 Å, manufactured by ATDF)

Polishing pad: polyurethane lamination polishing pad (tradename: IC-1010, manufactured by Rohm and Haas Company)

Polishing pressure: 0.7 psi (=about 4.8 kPa)

Number of revolutions of platen: 100 rpm

Supplying rate of polishing composition: 300 ml/min

Number of revolutions of carrier: 100 rpm

Evaluation of Dispersion Stability

Immediately after the preparation of the polishing composition, the transmittance at a wavelength of from 250 nm to 900 nm was obtained by using an ultraviolet-visible spectroscopy (tradename: UV-2450, manufactured by SHIMADZU CORPORATION). Then, the polishing composition was stored in a sealed container at 80° C. for 4 days, and in the same manner as above, the transmittance was obtained. Then, the dispersion stability was evaluated by the decreased rate of the transmittance calculated by the following calculation formula. The dispersion stability was evaluated by 3 levels based on the decreased rate of the transmittance, and from a good one, less than 2% (○), at least 2% and less than 5% (Δ), and at least 5% (X). The obtained results are shown in Table 2.

Decreased rate of transmittance (%): [(integration value of transmittance at a wavelength of from 250 to 900 nm immediately after the preparation)−(integration value of transmittance at a wavelength of from 250 to 900 nm after storage at 80° C. for 4 days)]/(integration value of transmittance at a wavelength of from 250 to 900 nm immediately after the preparation)×100

TABLE 2

|  | Stock removal rate (nm/min) | Dishing | Dispersion stability |
|---|---|---|---|
| Ex. 1 | 390 | ○ | ○ |
| Ex. 2 | 310 | ○ | ○ |
| Ex. 3 | 550 | Δ | Δ |
| Ex. 4 | 500 | ⊚ | ○ |
| Ex. 5 | 600 | Δ | ○ |
| Ex. 6 | 430 | ⊚ | ○ |
| Ex. 7 | 550 | Δ | ○ |
| Ex. 8 | 350 | ⊚ | ○ |
| Ex. 9 | 300 | ⊚ | ○ |
| Ex. 10 | 350 | Δ | Δ |
| Ex. 11 | 320 | Δ | ○ |
| Ex. 12 | 530 | Δ | ○ |
| Ex. 13 | 530 | ○ | ○ |
| Ex. 14 | 370 | Δ | ○ |
| Ex. 15 | 340 | Δ | ○ |
| Ex. 16 | 390 | Δ | ○ |
| Comp. Ex. 1 | 600 | ○ | X |
| Comp. Ex. 2 | 200 | — | ○ |
| Comp. Ex. 3 | 100 | — | ○ |
| Comp. Ex. 4 | 500 | Δ | X |
| Comp. Ex. 5 | 50 | — | X |
| Comp. Ex. 6 | 600 | X | X |
| Comp. Ex. 7 | 5 | — | ○ |
| Comp. Ex. 8 | 5 | — | ○ |
| Comp. Ex. 9 | 9 | — | ○ |
| Comp. Ex. 10 | 250 | X | X |
| Comp. Ex. 11 | 190 | Δ | ○ |
| Comp. Ex. 12 | 850 | X | ○ |

What is claimed is:

1. A polishing composition comprising (a) abrasive grains, (b) a processing accelerator, (c) at least one nonionic surfactant represented by R-POE (I), wherein R is a C 10-16 alkyl group having a branched structure, and POE is a polyoxyethylene chain, (d) at least one anionic surfactant, (e) a protective film-forming agent different from the nonionic surfactant or the anionic surfactant, (f) an oxidizing agent, and (g) water; wherein the concentration of the nonionic surfactant is from 0.02 to 0.2 wt %, based on the total weight of the composition, the nonionic surfactant has an HLB of from 8 to 12, and the anionic surfactant is present in an amount of from 0.005 to 0.1 weight %, based on the total weight of the polishing composition;

wherein the polishing composition is capable of providing a stock removal rate of at least 300 nm/min, a dishing amount of less than 50 nm, and a dispersion stability as measured by a rate of transmittance of less than 5%, when supplied at 300 mL/min during polishing a Cu blanket wafer in a polishing machine at 0.9 psi and 100 rpm.

2. The polishing composition according to claim 1, wherein the protective film-forming agent (e) is at least one selected from the group consisting of benzotriazole and its derivative.

3. The polishing composition according to claim 2, wherein the protective-film forming agent (e) is 1-[bis(2-hydroxyethyl)aminomethyl]-4-methylbenzotriazole or 1-[bis(2-hydroxyehtyl)aminomethyl]-5-methylbenzotriazole.

4. The polishing composition according to claim 1, wherein the abrasive grains have an average primary particle size of from 5 to 40 nm.

5. The polishing composition according to claim 1, wherein the processing accelerator (b) is at least one member selected from the group consisting of a carboxylic acid and an amino acid.

6. The polishing composition according to claim 1, wherein the abrasive grains (a) comprise silicon dioxide, aluminum oxide, cerium oxide, zirconium oxide, titanium oxide, or mixtures thereof.

7. The polishing composition according to claim 1, wherein the abrasive grains (a) are present in an amount of from 0.1 to 10 weight %, based on the total weight of the polishing composition.

8. The polishing composition according to claim 1, wherein the processing accelerator is a carboxylic acid or an amino acid.

9. The polishing composition according to claim 1, wherein the processing accelerator is present in an amount of from 0.1 to 30 weight %, based on the total weight of the polishing composition.

10. The polishing composition according to claim 1, wherein the at least one nonionic surfactant (c) represented by R-POE (I), wherein R is a C12-14 alkyl group having a branched structure.

11. The polishing composition according to claim 1, wherein the at least one nonionic surfactant (c) has an HLB of from 8 to 10.

12. The polishing composition according to claim 1, wherein the anionic surfactant (d) is represented by general formula (IIa) or (IIb)

R'-A (IIa)

R'-POA-A (IIb)

wherein R' is selected from the group consisting of an alkyl group, an alkylphenyl group and an alkenyl group, POA is a polyoxyalkylene chain selected from the group consisting of a polyoxyethylene chain, a polyoxypropylene chain and a poly(oxyethylene/oxypropylene) chain, and A is an anionic functional group.

13. The polishing composition according to claim 1, wherein the anionic surfactant (d) is represented by general formula (IIb)

R'-POA-A (IIb)

and comprises a polyoxyalkylene chain.

14. The polishing composition according to claim 1, wherein the protective film-forming agent (e) is benzotriazole and its derivative, triazole and its derivative, tetrazole and its derivative, indole and its derivative, or imidazole and its derivative.

15. The polishing composition according to claim 1, wherein the protective film-forming agent (e) is a benzotriazole derivative represented by the following formula (III)

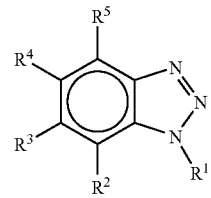

(III)

wherein $R^1$ is selected from the group consisting of hydrogen, an alkyl group, an alkyl group substituted with a carboxy group, an alkyl group substituted with a hydroxyl group and a tertiary amino group, and an alkyl group substituted with a hydroxyl group, and each of $R^2$ to $R^5$ is independently one selected from the group consisting of hydrogen and a $C_{1-3}$ alkyl group.

16. The polishing composition according to claim 15, wherein the benzotriazole derivative is selected from the group consisting of, 4-methyl-1H-benzotriazole, 5-methyl-1H-benzotriazole, 1-(2',3'-dihydroxypropyl)benzotriazole, 1-(2',3'-dihydroxypropyl)-4-methylbenzotriazole, 1-(2',3'-dihydroxypropyl)-5-methylbenzotriazole, 1-[N,N-bis(hydroxyethyl)aminomethyl]benzotriazole, 1-[N,N-bis(hydroxyethyl)aminomethyl]-4-methylbenzotriazole, 1-[N,N-bis(hydroxyethyl)aminomethyl]-5-methylbenzotriazole, 1-hydroxymethyl-1H-benzotriazole, 1-hydroxymethyl-4-methyl-1H-benzotriazole, 1-hydroxymethyl-5-methyl-1H-benzotriazole, 3-(4-methyl-1H-benzotriazole-1-yl) butyric acid, 3-(5-methyl-1H-benzotriazole-1-yl) butyric acid, α-methyl-1H-benzotriazole-1-methanol, α-ethyl-1H-benzotriazole-1-methanol, α-isopropyl-1H-benzotriazole-1-methanol, 1H-benzotriazole-1-acetic acid, 1-(2-hydroxyethyl)-1H-benzotriazole, 1-[[bis(2-hydroxypropyl)amino]methyl-1H-benzotriazole and 4,5-dimethyl-1H-benzotriazole.

17. The polishing composition according to claim 1, wherein the protective film-forming agent is present in an amount of from 0.001 to 0.3 weight %, based on the total weight of the polishing composition.

18. The polishing composition according to claim 1, wherein the oxidizing agent (f) is present in an amount of at least 0.3 weight %, based on the total weight of the polishing composition.

* * * * *